United States Patent

Weber et al.

[11] Patent Number: 5,872,507
[45] Date of Patent: Feb. 16, 1999

[54] PROCESS FOR NON-CONTACT DISTANCE MEASUREMENT

[75] Inventors: Jens Weber, Kelkheim-Fischbach; Jürgen Hoetzel, Michelstadt; Ega Tschiskale, Darmstadt, all of Germany

[73] Assignee: Robert Bosch GmbH, Stuttgart, Germany

[21] Appl. No.: 875,219

[22] PCT Filed: Dec. 12, 1995

[86] PCT No.: PCT/DE95/01778

§ 371 Date: Sep. 12, 1997

§ 102(e) Date: Sep. 12, 1997

[87] PCT Pub. No.: WO96/22548

PCT Pub. Date: Jul. 25, 1996

[30] Foreign Application Priority Data

Jan. 20, 1995 [DE] Germany .................. 195 01 642.4

[51] Int. Cl.⁶ .................................................. B60Q 1/00
[52] U.S. Cl. ........................... 340/435; 340/436; 367/96; 367/99; 367/909; 701/301
[58] Field of Search .................... 340/435, 436, 340/903; 367/96, 99, 112, 909; 701/301, 300

[56] References Cited

U.S. PATENT DOCUMENTS 4,095,666   6/1978   Baba et al. ............................... 180/169
4,887,066  12/1989   Marek ...................................... 340/436
5,508,974   4/1996   Meyer et al. ............................. 367/99
5,574,426  11/1996   Shisgel et al. ........................... 340/435
5,724,141   3/1998   Nishiro .................................... 340/903
5,739,901   4/1998   Fujiska et al. .......................... 356/5.01
5,754,099   5/1998   Nishimura et al. ...................... 340/435

FOREIGN PATENT DOCUMENTS 40 23 538   1/1992   Germany .

OTHER PUBLICATIONS

Lawrenz, W. et al., "CAN–Control unit Area Network for In–vehicle Applications," SAE Information Report.
Botzenhardt, W. et al., "Bus System for Vehicle Control Modules," VDI Reports No. 612, 1986, pp. 459–470.
Lawrenz, W., "Entwicklungswerkzeuge für Controller–Netzwerke," Elektronik 16, Sep. 4, 1987, pp. 136–140.

Primary Examiner—Edward Lefkowitz
Attorney, Agent, or Firm—Kenyon & Kenyon

[57] ABSTRACT

In a procedure for non-contact distance measurement, in particular to measure the distance from obstacles in the immediate vicinity of motor vehicles, measurements are made using a first measuring procedure, and in a first measuring range absolute values of the respective distance are determined. Using a second measuring procedure, relative values are determined in a second measuring range that overlaps the first. Absolute values of the first measuring procedure, which lie inside the overlapping range, are used to calibrate the relative values of the second measuring procedure.

11 Claims, 4 Drawing Sheets

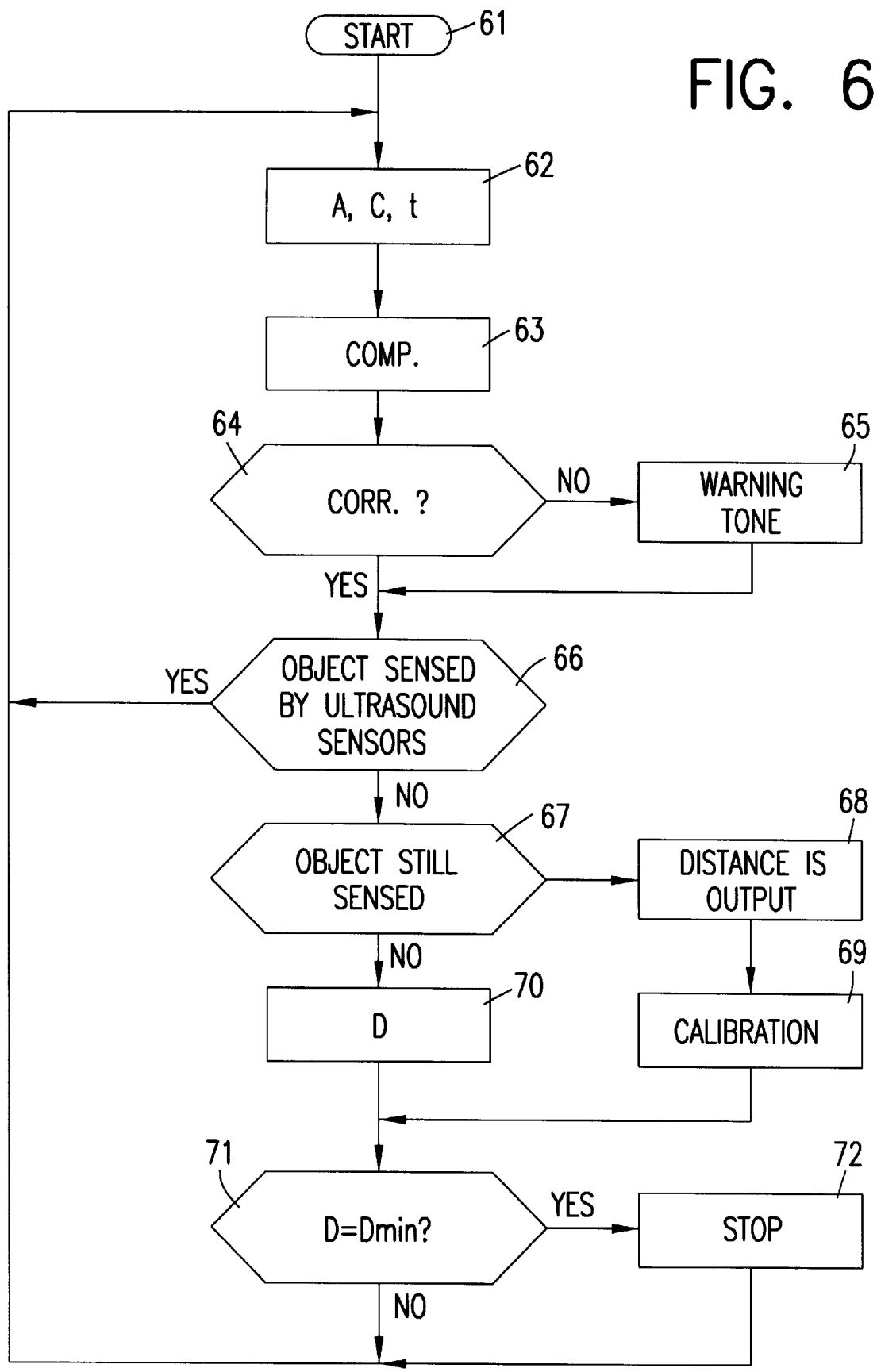

PROCESS FOR NON-CONTACT DISTANCE MEASUREMENT

FIELD OF THE INVENTION

The present invention relates to a procedure for non-contact distance measurement, in particular for measuring the distance from obstacles in the immediate vicinity of motor vehicles.

BACKGROUND INFORMATION

Various distance measuring procedures are known for collision warning devices also known as parking aids. German Patent Application No. 40 23 538 describes a collision warning device based on ultrasound in which at least two ultrasound sensors are mounted at a specified distance from each other. In this procedure, the delay times between the time when an ultrasound signal is emitted and a reflected ultrasound signal is received from the same and from the other ultrasound sensors are measured and evaluated.

The measuring range of ultrasound sensors is limited by the beam angle, the size of the obstacle, its reflective properties and by the detection threshold of the sensor. This means, for one thing, that a "dead angle" results for each of the ultrasound sensors. In addition, within the recording angle, no distance measurement will be carried out within the immediate vicinity because of the decay period of the sensors.

In contrast, capacitive sensors have the advantage that measurement is possible up to the shortest distances. In addition, if the sensor is designed appropriately, a measurement without voids can be carried out over the entire vehicle width. However, these advantages are countered by the disadvantage that, due to the various materials, sizes and shapes of the possible obstacles, no firm connection exists between the distance and the measurable capacitance in each case, i.e. only relative distance values are determined.

British Patent No. 2,266,397 describes a motor vehicle parking aid in which a distance to a possible obstacle is monitored using an ultrasound sensor. Since the ultrasound sensor cannot monitor all areas, in particular not the area in the proximity of the vehicle, a second measuring system is provided. This measuring system is configured as a capacitive system and detects obstacle at a minimum distance from the vehicle. The publication, Kramar E., "Funksysteme für Ortung und Navigation" (Radio systems for location and navigation), 1973, Verl. Berliner Union GmbH, Stuttgart, Germany, pp. 28 and 29, discloses a phase difference measuring process for measuring the distance between two radiation sources A and B, in which radiation sources A and B transmit in-phase HF signals, received at the receiving station with a certain phase difference.

The object of the present invention is to provide a procedure for non-contact distance measurement, in particular for measurement of the distances from obstacles in the immediate vicinity of motor vehicles, in which measurement of short distance values is also possible.

SUMMARY OF THE INVENTION

This object is achieved by using the present invention in that measurements are made using a first measuring procedure in which absolute values are determined for the current distances in a first measuring range; that using a second measuring procedure relative values are determined in the measuring range that overlaps the first one, and that absolute values of the first measuring procedure which lie within the overlapping area are used to calibrate the relative values from the second measuring procedure.

The procedure according to the present invention has the advantage that the distance measurement calibration is performed using the second measuring procedure, which does not give any absolute values per se, so that ultimately absolute values will be available.

Although the process for the procedure according to the present invention can be implemented using a number of measuring procedures, it is advantageous if the first measuring procedure is based on a delay time measurement of waves emitted, reflected and received again and the second measuring procedure is based on a measurement of an electrical, magnetic, or optical variable. According to the present invention, the first measuring procedure will be preferably carried out using ultrasound waves and the second measuring procedure measures a capacitance that is formed between an electrode and the environment with the obstacles.

This further development has the advantage that, with an appropriate electrode that extends over the entire width of the vehicle, a measurement of the distance without voids is possible over the entire width of the vehicle.

One of the advantageous embodiments of the procedure according to the present invention consists of storing a relationship between the relative values determined using the second measuring procedure and the actual distance for various parameters in a map consisting of a number of characteristic curves and selecting one characteristic curve for calibration, which will be used in the following measurements using the second measuring procedure by inputting at least one absolute value determined using the first measuring procedure as the actual distance and the simultaneously determined relative value. To do this, the individual characteristic curves can be recorded by empirical tests with various obstacles.

Another advantageous embodiment according to the present invention consists of storing a relationship between the relative values determined using the second measuring procedure, the actual distance, and a calibration factor as an equation and calculating the calibration factor for calibration by inputting at least one absolute value determined using the first measuring procedure as the actual distance and the simultaneously determined relative value which in the following measurements is used using the second measuring procedure. In this simplified embodiment, a similar behavior is assumed for various obstacles.

The absolute values provided for calibration using the first measuring procedure can be subject to an interference from various influences. Also the interference signals can be superimposed on the output signal of the sensor used for the second measuring procedure. Therefore, according to a further development of the procedure according to the present invention, several absolute values lying in the overlapping area are used for calibration. In this process, greatly deviating absolute values can be disregarded.

The frequent uses of the procedure according to the present invention result during approach to an obstacle. In this process, at first, measuring results from the first measuring procedure are available. If then an overlapping measuring range is reached, considering the lateral position of the obstacle, due to the distance diminishing, the calibration for the second measuring procedure follows. With further decreasing distance, the first measuring procedure then supplies no more measurements; these are supplied only by the second measuring procedure. In order to rule out the use of incorrect absolute values during the calibration, it can also be provided that the time sequence of the absolute values be considered during the calibration.

The approach to the obstacle described above does not occur in every case in which the distance is supposed to be measured. This means that, for example, it may be that an obstacle comes so close while the sensors are switched off that when they are switched on it is not located in the measuring range according to the first measuring procedure. Then no calibration can occur, either. In order to obtain a display that can be evaluated in all cases, it is therefore provided according to another further development of the present invention that with distances lying outside the measuring range of the first measuring procedure, calibrated relative values are output that were determined according to the second measuring procedure, if absolute values were determined according to the first measuring procedure, and that otherwise a warning signal is output independently of the relative values determined.

BRIEF DESCRIPTION OF THE DRAWINGS

FIG. 6 shows an embodiment of a computer program for carrying out the procedure according to the present invention.

DETAILED DESCRIPTION OF THE INVENTION

Figure 1:
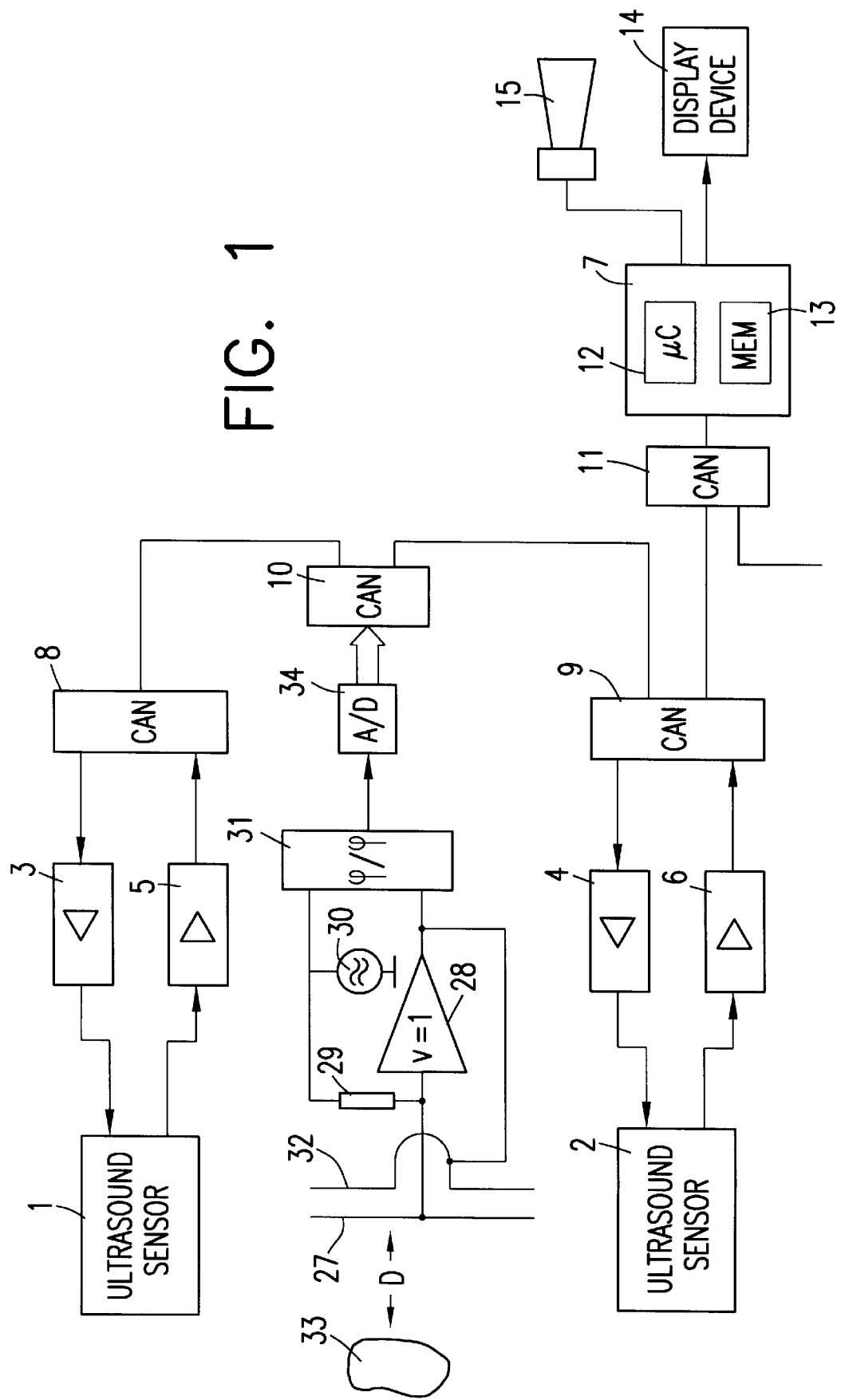
FIG. 1 shows a block wiring diagram of a device for carrying out the procedure according to the present invention.

In the arrangement shown in FIG. 1, two ultrasound sensors 1, 2 are provided, each of which receives an alternating voltage from an amplifier 3, 4 for transmitting and each of which is connected to a receiving circuit 5, 6. Ultrasound sensors 1, 2, amplifiers 3, 4 and receiving circuits 5, 6 are known per se and do not require further explanation in connection with the present invention. The control of amplifiers 3, 4 and the transmission of the output signals of receiving circuits 5, 6 occur from and to a control unit 7 with the use of a CAN network (CAN=Controller Area Network) which has a CAN control unit 8, 9, 10, 11 for each of the connected components. A similar network is described, e.g. in Lawrenz, W., et al.: "CAN-Control unit Area Network for In-vehicle Network Applications," SAE Information Report J1583, Botzenhardt, W. et al.: "Bus System for Vehicle Control Modules," VDI Reports No. 612, 1986, Pages 459 to 470 and Lawrenz, W.: "Entwicklungswerkzeuge für Controller-Netzwerke" (Development Tools for Control unit Networks), Elektronik 16/Sep. 4, 1987, Pages 136 to 140. In FIG. 1 only those CAN control units are shown that are associated with the device used to carry out the procedure according to the present invention.

Control unit 7 contains a microcomputer 12 and memory 13. A program for microcomputer 12 carries out the individual steps of the procedure according to the present invention. A display device 14 and an acoustic signaling device 15 are connected to one output of control unit 7.

Figure 2:
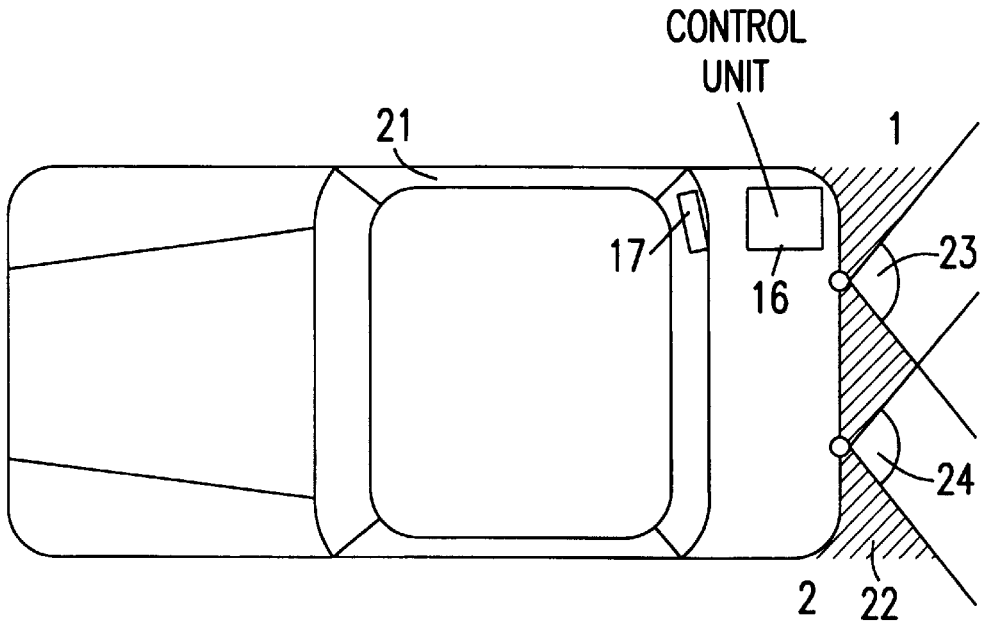
FIG. 2 shows an illustration displaying the limits of the measuring range according to a conventional procedure.

FIG. 2 shows a diagram of a motor vehicle 21, on the rear end of which two ultrasound sensors 1, 2 are mounted. Ultrasound sensors 1, 2 have a sensing angle, outside of which obstacles cannot be sensed. These areas 22 are shown shaded in FIG. 2. In addition, within the sensing angle in the area of the sensor there are also other areas 23, 24, in which distance measurement is likewise impossible. In FIG. 2, a control unit 16 and a display device 17 are also indicated.

Figure 3:
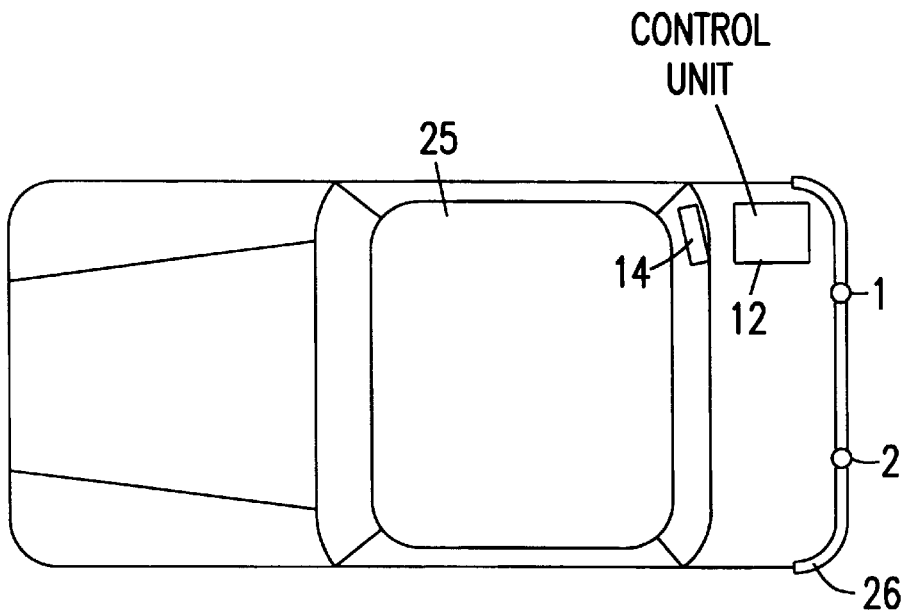
FIG. 3 shows the arrangement of sensors on a motor vehicle for carrying out the procedure according to the present invention.

In motor vehicle 25, shown in FIG. 3, equipped for carrying out the procedure according to the present invention two ultrasound sensors are mounted on the rear end. In addition, a capacitive sensor 26 extends over the entire rear bumper.

As shown in FIG. 1, capacitive sensor 26 is formed by an electrode 27 that is connected with the input of an amplifier 28 and, using a resistor 29, to a sine-wave generator 30. The output voltage of the amplifier 28 and the voltage of sine-wave generator 30 are supplied to a phase comparator circuit 31. The phase difference depends on the capacitor formed by electrode 27 to ground. In the ideal case, in addition to electrode 27, this capacitor is formed also by the area behind the vehicle with the obstacles to be recorded as a counter-electrode.

However, since body parts, in particular the bumper of the vehicle, are mounted very close to electrode 27 for design reasons, the capacitance formed by the above arrangement would be significantly higher. Thus in order to reduce this effect, a shield 32 is provided that is mounted between electrode 27 and the conductive vehicle parts and receives a voltage that is preferably substantially equal to the voltage at the electrode. This is achieved with a gain of v=1 of amplifier 28.

In spite of this measure, the capacitance to be measured with phase comparator circuit 31 is not only dependent on the distance d of obstacle 33, but in particular on its size, shape and dielectric coefficient. At greater distances and/or with smaller obstacles, the capacitance between electrode 27 and the roadway also has to be considered. A signal corresponding to the phase difference is supplied to CAN control unit 10 via an analog/digital converter 34 and sent on to control unit 7.

Figure 4:
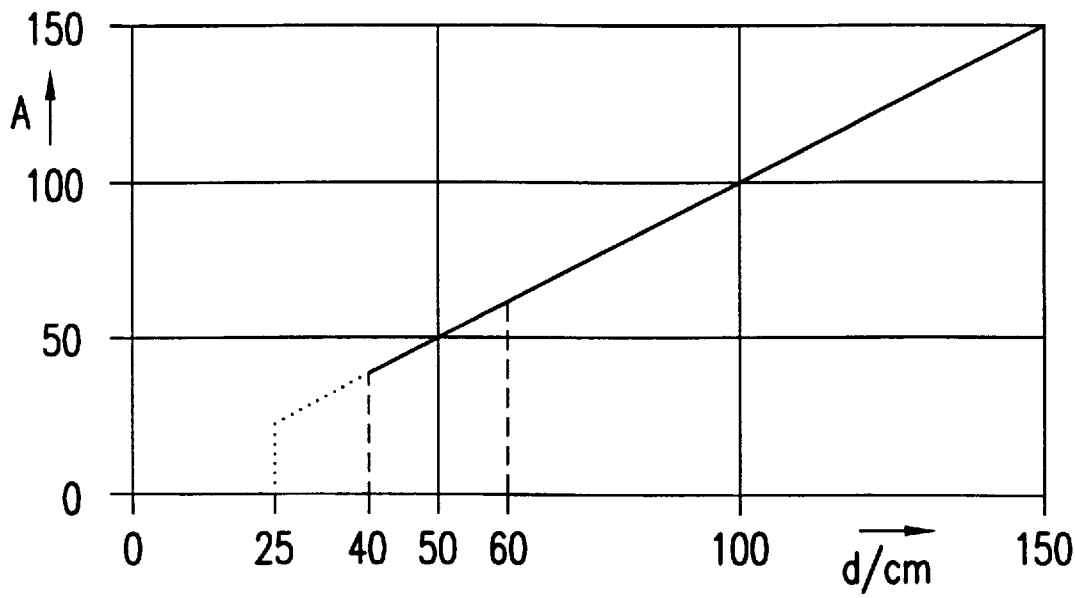
FIG. 4 shows a representation of absolute values determined according to the first measuring procedure of the present invention as a function of the distance.
Figure 5:
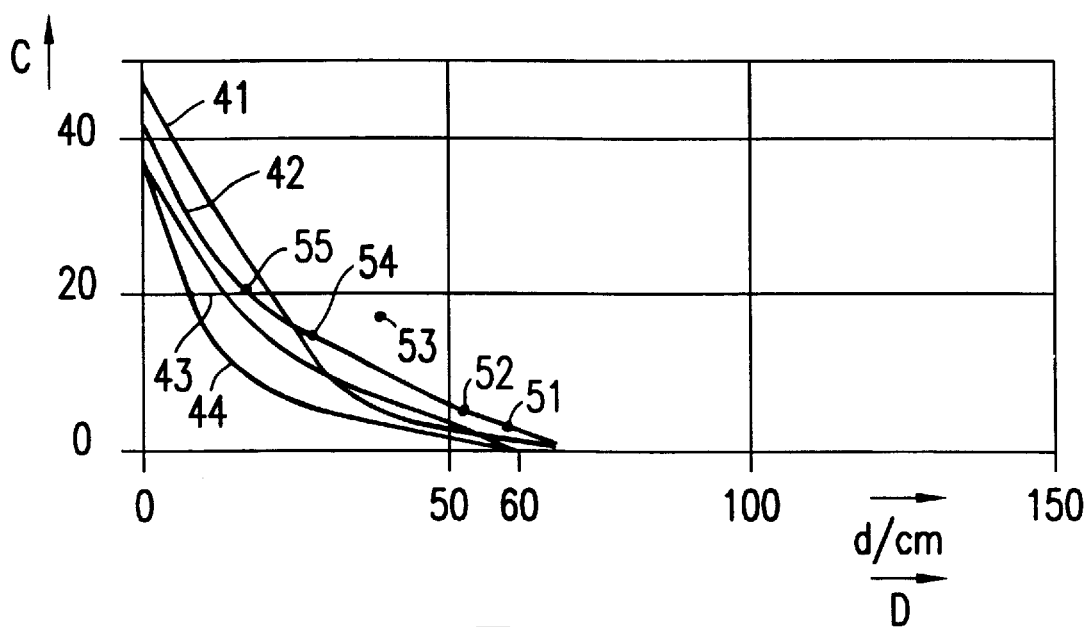
FIG. 5 shows several characteristic curves of a capacitive sensor to be calibrated.

In FIGS. 4 and 5, the relationships to distance of the output signals of an ultrasound sensor and of a capacitive sensor are contrasted in a range from 0 cm to 150 cm. In this process, the output signal A of the ultrasound sensor is an absolute value and is shown in FIG. 4 as calibrated in cm. FIG. 4 shows that a linear relationship exists between output signal A and distance d. However, depending on the details of the ultrasound sensor design, the smallest measurable distance lies between 25 cm and 40 cm. Output signal C of the capacitive sensor is shown in FIG. 5 as capacitance change compared to a capacitance that is measured with an obstacle located at a very great distance. The function for the relationship to distance d corresponds in the first approximation to a hyperbola, but can deviate from that, depending on shape, position and size of the obstacle.

FIG. 5 shows measured characteristic curves 41 to 44 for various obstacles. In this case, it is entirely possible that the characteristic curves intersect. In the example shown for the characteristic curves of the capacitive sensor, the measuring range can be given at about 0 cm to 60 cm distance, since there are signals here that can be evaluated and differ sufficiently from 0. Thus the measuring ranges of the ultrasound sensors overlap with that of the capacitive sensor between 25 cm to 40 cm and 50 cm. Within this area, calibration of the relative values determined by the capacitive sensor is possible because of the absolute values of the ultrasound sensors. Calibration can be carried out, for example, by selecting one of the characteristic curves that is valid for the distances measured with the ultrasound sensors and the values of output signal C that are present at the same time.

If, during an approach to an obstacle, the distance becomes less than 60 cm, several measurements of the ultrasound sensors and of the capacitive sensor within the overlapping area will be read and used as input variables for the map according to FIG. 5—namely the measurements A of the ultrasound sensors as values for the distance and those of the capacitive sensor as output signal C. Let us assume, for example, that this results in points 51, 52, 53, 54, 55. Points 51, 52, 54, 55 lie on the characteristic curve 42 so these are used for calibration of the output signal of the capacitive sensor during further approach to the obstacle. Point 53 lies too far away from the characteristic curve so it is interpreted as an incorrect measurement. In the subsequent usage of characteristic curve 42 for distance measurement with the capacitive sensor, the output signal of the sensor and/or the change in the capacitance value is compared to the stored table and the distance is read out.

The process steps shown in FIG. 6 as a flow chart for microcomputer 12 in control unit 7 will be started after being switched on at 61. In a first subprocess 62, the measurements of the two ultrasound sensors 1, 2 are recorded and an absolute value A for the respective distance is calculated by triangulation. In addition, the capacitance value C is recorded. Values A and C, together with a given time t, are stored in a memory.

Drift compensation of values A and C occurs at 63. For the sake of simplicity, the compensated values are also indicated in the following with A and C. The drift compensation is required, for example, due to dependence on temperature.

At 64, a decision is made depending on whether a correlation exists between the two values A, C recorded at 62 and the previously recorded values—if such are present—and the calculated parameters from calibration, e.g. the selection of the characteristic curve 42. If there is no correlation, an abrupt change compared to the last measurement will be assumed. An obstacle, which for example, was not present during the last program run has appeared when the program is run again. In these cases, a warning tone will be output at 65.

A check is carried out at 66 to see whether or not the ultrasound sensors have sensed an object yet. If they have not, the program is rerun, starting with subprogram 62.

Otherwise, if the ultrasound sensors have sensed an obstacle in previous program runs, it branches off again at 67, depending on whether the ultrasound sensors continue to sense an obstacle. If this is the case, the distance measured with the ultrasound sensors between vehicle and obstacle will be output at 68. In addition, calibration will be carried out at 69, e.g. the selection of one of the characteristic curves shown in FIG. 5.

However if it is determined at 67 that the ultrasound sensors no longer sense any obstacle, it is a case in which during one of the earlier program runs the ultrasound sensors sensed an obstacle and calibration was carried out in subprogram 69. This calibration will then be used at 70 to calculate distance D determined by the capacitive sensor, which will be output. After both subprogram 69 and subprogram 70, a check will be carried out at 71 on whether the calibrated signal D has reached a value Dmin. If this is the case, a warning, e.g. the display of the word Stop, will be output at 72. However, if Dmin has not been reached yet, the program will be rerun starting at 62, without any output.

We claim:

1. A process for measuring a non-contact distance to at least one obstacle, comprising the steps of:

measuring a capacitance between an electrode and the at least one obstacle;

determining absolute values of the non-contact distance in a first measuring range using a first measuring procedure;

determining relative values of the non-contact distance in a second measuring range using a second measuring procedure, the second measuring procedure including the measurement of the capacitance, the second measuring range overlapping with the first measuring range to form an overlapping area;

calibrating the relative values using the absolute values arranged within the overlapping area;

storing, in a map, a relationship between the relative values and an actual distance, the map including a plurality of characteristic lines formed by individual measured points;

selecting a characteristic line of the plurality of characteristic lines to be calibrated using at least one of the absolute values; and utilizing the characteristic line in at least one further measurement using the second measuring procedure.

2. The process according to claim 1, wherein the non-contact distance includes a further distance from the at least one obstacle in an immediate vicinity of a motor vehicle.

3. The process according to claim 1, wherein the first measuring procedure corresponds to a delay time measurement of emitted, reflected and received waves, and wherein the second measuring procedure corresponds to a measurement of at least one of an electrical variable, a magnetic variable and an optical variable.

4. The process according to claim 3, wherein the first measuring procedure is performed using ultrasound waves.

5. The process according to claim 1, further comprising the steps of:

determining calibrated relative values using the second measuring procedure;

outputting the calibrated relative values for distances outside the first measuring range if the absolute values have been previously determined using the first measuring procedure; and if the absolute values have not been previously determined using the first measuring procedure, generating a warning signal separately from the determined relative values.

6. A process for measuring a non-contact distance, comprising the steps of:

measuring a capacitance between an electrode and at least one obstacle;

determining absolute values of the non-contact distance in a first measuring range using a first measuring procedure;

determining relative values of the non-contact distance in a second measuring range using at least one of the first measuring procedure and a second measuring procedure, at least one of the first measuring procedure and the second measuring procedure including the measurement of the capacitance, the second measuring range overlapping with the first measuring range to form an overlapping area;

calibrating the relative values using the absolute values arranged within the overlapping area;

determining a relationship between the relative values and an actual distance;

forming a calibration factor using a predetermined equation to form a plurality of characteristic lines formed by measured points, the calibration factor being calculated for a calibration procedure by inputting at least one of the relative values determined using the first procedure and then utilized using the second measuring procedure;

selecting a characteristic line of the plurality of characteristic lines to be calibrated using at least one of the absolute values; and utilizing the characteristic line in further measurements using the second measuring procedure.

7. The process according to claim 4, wherein the absolute values arranged within the overlapping area are used for the calibration procedure.

8. The process according to claim 7, further comprising the step of:

discarding selected absolute values that are outside a predetermined threshold range.

9. The process according to claim 7, wherein, during the calibration procedure, a time sequence is utilized.

10. The process according to claim 8, wherein, during the calibration procedure, a time sequence is utilized.

11. The process according to claim 6, further comprising the steps of:

determining calibrated relative values using the second measuring procedure;

outputting the calibrated relative values for distances outside the first measuring range if the absolute values have been previously determined using the first measuring procedure; and if the absolute values have not been previously determined using the first measuring procedure, outputting a warning signal separately from the determined relative values.

* * * * *